PIEZOELECTRIC COMPOSITION AND METHOD OF PREPARING THE SAME

Filed Dec. 14, 1965

INVENTORS
SHIGERU HAYAKAWA
HIROMU OUCHI
KANEOMI NAGASE

United States Patent Office 3,449,253

Patented June 10, 1969

3,449,253

PIEZOELECTRIC COMPOSITION AND METHOD OF PREPARING THE SAME

Shigeru Hayakawa, Hirakata-shi, Hiromu Ouchi, Toyonaka-shi, and Kaneomi Nagase, Sakai-shi, Osaka-fu, Japan, assignors to Matsushita Electric Industrial Co., Ltd., Osaka, Japan Filed Dec. 14, 1965, Ser. No. 513,799
Int. Cl. C04b 35/00
U.S. Cl. 252—62.9 7 Claims

ABSTRACT OF THE DISCLOSURE

A process for preparing a solid solution piezoelectric ceramic material in a single phase of perovskite type structure. Undesirable pyrochlore-type structure is eliminated by using a high heating rate of 10° to 50° C./minute in a temperature range of 500° to 650° C. during the firing step. In addition the step of adding an excess of magnesium oxide also reduces pyrochlore-type structure.

This invention relates to piezoelectric ceramic compositions and articles of manufacture frabricated therefrom and process for making such compositions. More particularly, the invention relates to novel ferroelectric ceramics which are polycrystalline aggregates of certain constituent. These piezoelectric compositions are sintered to ceramics by ordinary ceramic techniques and thereafter ceramics are polarized by applying a D-C voltage between the electrodes in a purpose to impart thereto electromechanical transducing properties similar to the well known piezoelectric effect. The invention also encompasses the calcined product of raw ingredients and the articles of manufacture such as electromechanical transducers fabricated from the sintered ceramic.

The use of piezoelectric materials in various transducer applications in the production, measurement and sensing of sound, shock, vibration, pressure, etc., have increased greatly in recent years. Both crystal and ceramic types of transducers have been widely used. But. because of their potentially lower cost and facility in the fabrication of ceramics with various shapes and sizes and their greater durability for high temperature and/or for humidity than that of crystalline substances such as Rochelle salt, piezoelectric ceramic materials have recently become important in various transducer applications.

The piezoelectric characteristics of ceramics vary with species of applications. For example, electromechanical transducers such as phonograph pick-up and microphone require piezoelectric ceramics characterized by a substantially high electromechanical coupling coefficient and dielectric constant. On the other hand, piezoelectric ceramics for electric wave filters should have a specified value of coupling coefficient and a high mechanical quality factor.

In copending application Ser. No. 450,738 filed Apr. 26, 1965, new Patent No. 3,268,453, one of the present inventors has disclosed that a solid solution ceramics of $Pb(Mg_{1/3}Nb_{2/3})O_3$-$PbTiO_3$-$PbZrO_3$ basic ternary system system and its modifications with certain additives or with certain substituents provide electromechanical transducers having a number of advantages over previous transducers. The solid solution of the ternary system exists in a perovskite-type structure. However, it is difficult for the ternary ceramic to exist in a single phase of perovskite-type structure provided with active electromechanical transducing properties, even when the ceramic is fired at high temperatures. The ternary ceramic is liable to be in two phases of said pervoskite-type structure and the pyrochlore-type structure of $Pb_2Nb_2O_7$ which is not piezoelectric material and deteriorates the piezoeelectric properties of resultant material. Therefore, it is important to eliminate the undesirable pyrochlore-type structure from the ternary solid solution ceramics for obtaining preferable piezoelectric properties.

It is an object of this invention to provide novel piezoelectric ceramic materials characterized by high relative dielectric constant and piezoelectric response.

It is another object to provide piezoelectric ceramic compositions in a single phase of perovskite structure and a process of preparing the said compositions.

These objects and the manners of their attainment will be readily apparent from the following descriptions in connection with the accompanying drawings wherein.

Figure 1:
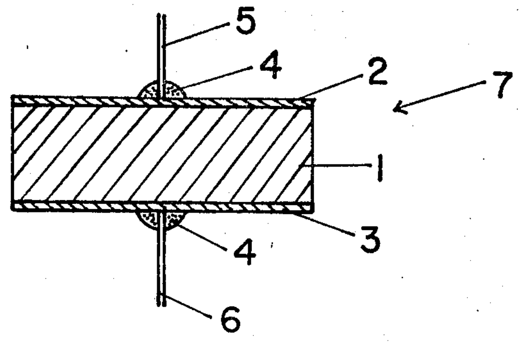
FIGURE 1 is a cross-sectional view of an electromechanical transducer in accordance with the present invention.

Before proceeding with a detailed description of the piezoelectric materials contemplated by the invention, their application in electromechanical transducers will be described with reference to FIGURE 1 of the drawings wherein reference character 7 designates, as a whole, an electromechanical transducers having, as its active element, a preferably disc shaped body 1 of piezoelectric ceramic materials according to the present invention.

Body 1 is electrostatically polarized, in a manner hereinafter set forth, and is provided with a pair of electrodes 2 and 3 applied in a suitable manner, on two opposed surfaces thereof. Wire leads 5 and 6 are attached conductively to the electrodes 2 and 3 respectively by means of solder 4. When the ceramic is subjected to shock, vibration, or other mechanical stress, an electrical output generated can be taken from wire leads 5 and 6. Conversely as with other piezoelectric transducers, application of electrical voltage to electrodes 5 and 6 will result in mechanical deformation of the ceramic body. It is to be understood that the term electromechanical transducer as used herein is taken in its broadest sense and includes piezoelectric filter, frequency control devices, and the like, and that the invention may also be used and adapted for various other applications requiring materials having dielectric, piezoelectric and/or electrostrictive properties.

Figure 2:
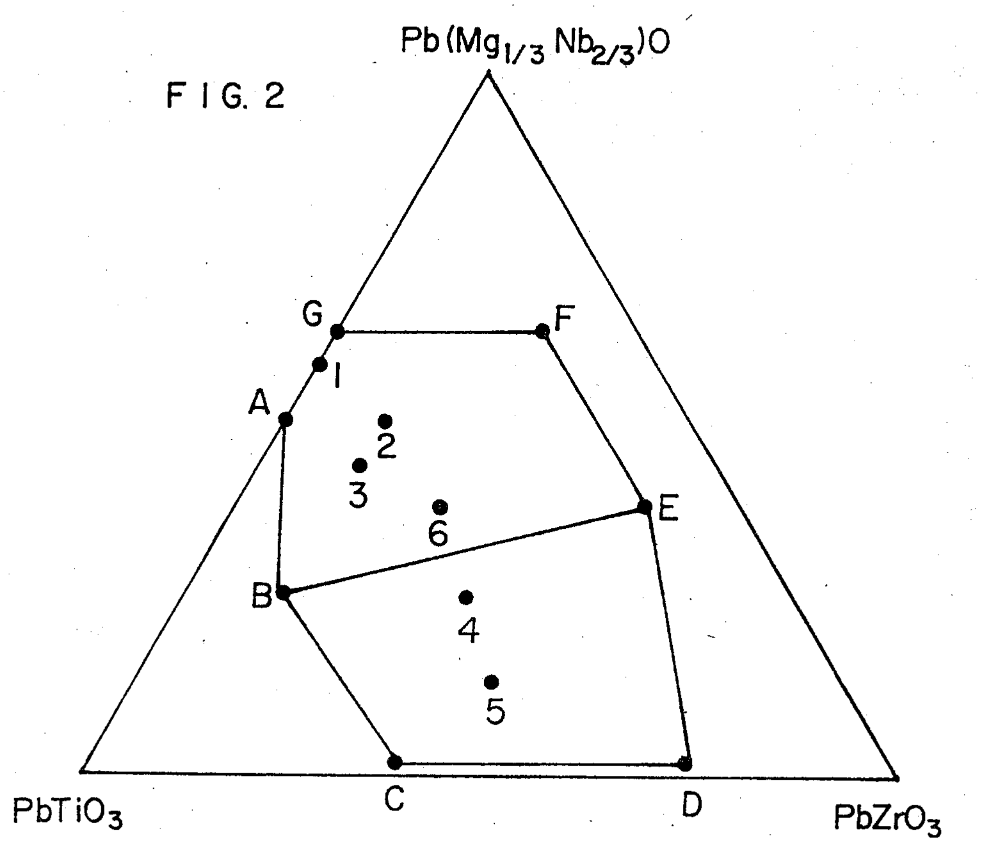
FIGURE 2 is a triangular compositional diagram of materials utilized in the present invention.

All possible compositions coming within the ternary system $Pb(Mg_{1/3}Nb_{2/3})O_3$-$PbTiO_3$-$PbZrO_3$ are represented by the triangular diagram constituting FIGURE 2 of the drawings. According to the patent described above, a preferable piezoelectric property is achieved by compositions in the area of the diagram bounded by lines connecting points ABCDEFG in FIGURE 2 wherein the molar percent of the three components of the above said points ABCDEFG are as follows:

| | $Pb(Mg_{1/3}Nb_{2/3})O_3$ | $PbTiO_3$ | $PbZrO_3$ |
|---|---|---|---|
| A | 50.0 | 50.0 | 0 |
| B | 25.0 | 62.5 | 12.5 |
| C | 1.0 | 61.5 | 37.5 |
| D | 1.0 | 24.0 | 75.0 |
| E | 50.0 | 12.5 | 37.5 |
| F | 62.5 | 12.5 | 25.0 |
| G | 62.5 | 37.5 | 0 |

According to this invention, a differential thermal analysis has been made with a mixture of $PbO$, $MgO$, $Nb_2O_5$, $TiO_2$ and $ZrO_2$ prepared in a such manner so as to produce a stoichiometric ternary solid solution of $$Pb(Mg_{1/3}Nb_{2/3})O_3\text{-}PbTiO_3\text{-}PbZrO_3$$

From the analysis it has been discovered that the mixture forms initially $PbTiO_3$ in perovskite-type structure and $Pb_2Nb_2O_7$ in pyrochlore-type structure at temperatures of 600° C. to 650° C. Subsequently, $PbZrO_3$ in perovskite-type structure and $Pb(Mg_{1/3}Nb_{2/3})O_3$ in perovskite-type structure are formed in addition to the $PbTiO_3$ and the $Pb_2Nb_2O_7$ in a vicinity of 800° C., and finally a solid solution of $Pb(Mg_{1/3}Nb_{2/3})O_3$-$PbTiO_3$-$PbZrO_3$ is formed above 850° C. The final solid solution is liable to be accompanied by the $Pb_2Nb_2O_7$ in pyrochlore-type structure which deteriorates the piezoelectric properties. An amount of the $Pb_2Nb_2O_7$ in the final solid solution decreases with an increase in the firing temperature and the firing cycle. The ternary compositions having the higher molar percent of $Pb(Mg_{1/3}Nb_{2/3})O_3$ are accompanied by the higher amount of the $Pb_2Nb_2O_7$.

These steps of the solid-state reaction of ternary system also can be verified by an X-ray analysis. Pressed mixtures in various compositions listed in Table I is fired at various temperatures for 1 hour and air-quenched. The heating rate is approximately 5° C. per minute. The specimen number in Table 1 also corresponds to that in FIGURE 2 illustrating the triangular compositional diagram of said ternary system. The X-ray analysis of the air-quenched samples indicates that the higher molar percent of $Pb(Mg_{1/3}Nb_{2/3})O_3$ and the lower firing temperature result in the existence of appreciable amounts of pyrochlore-type $Pb_2Nb_2O_7$ as shown in Table 1, wherein amounts of the two phases are estimated from the ratio of respective peak intensity of X-ray patterns.

weight percent of excessive magnesium oxide varies with a variation in compositions of base ternary solid solution. An X-ray analysis indicates that a lower content of excessive magnesium oxide is not sufficient to eliminate the $Pb_2Nb_2O_7$ in the final product and a higher content of excessive magnesium oxide produces a final product including two phases of perovskite structure of the ternary solid solution and magnesium oxide phase. The higher molar percent of $Pb(Mg_{1/3}Nb_{2/3})O_3$ in the ternary solid solution requires the higher amount of said excessive magnesium oxide to produce a single phase of perovskite-type structure in the resultant solid solution. According to the present invention, it has been discovered that the ternary solid solution ceramics in a single phase remarkably improve relative dielectric constant ($\epsilon$), electromechanical planar coupling coefficient ($k_p$) and mechanical quality factor ($Q_M$). The $\epsilon$, $k_p$ and $Q_M$ of the ternary solid solution ceramics increase with an increase in the excessive magnesium oxide and show an optimum value in a range of single phase and then decrease with a further increase in the excessive magnesium oxide. The further addition of excessive magnesium oxide produces a magnesium oxide phase in the resultant ceramics and deteriorates the $\epsilon$, $k_p$ and $Q_M$.

TABLE 1

| Example No. | Composition (molar percent) | | | Relative amounts of two phases (percent) — Firing temperature | | | | | |
|---|---|---|---|---|---|---|---|---|---|
| | | | | 900° C. | | 1,050° C. | | 1,250° C. | |
| | $Pb(Mg_{1/3}Nb_{2/3})O_3$ | $PbTiO_3$ | $PbZrO_3$ | Pero | Pyro | Pero | Pyro | Pero | Pyro |
| 1 | 59.00 | 41.00 | 0 | 60 | 40 | 65 | 35 | 75 | 25 |
| 2 | 50.00 | 37.50 | 12.5 | 85 | 15 | 85 | 15 | 90 | 10 |
| 3 | 43.75 | 43.75 | 12.5 | 90 | 10 | 92 | 8 | 94 | 6 |
| 4 | 25.00 | 37.50 | 37.50 | 95 | 5 | 98 | 2 | ~100 | 1 |
| 5 | 12.50 | 43.50 | 44.0 | 97 | 3 | ~100 | 1 | ~100 | 1 |

Pero=Perovskite phase; Pyro=Pyrochlore phase.

The reason for the existence of the $Pb_2Nb_2O_7$ in the resultant product may be explained as follows:

The $Pb_2Nb_2O_7$ is formed easily at low temperatures as mentioned above and has a different crystal structure, i.e. pyrochlore-type structure, from the perovskite-type structure. This difference in crystal structure may make it difficult for the $Pb_2Nb_2O_7$ to dissolve in the perovskite-type structure. Another reason may be that the $Pb_2Nb_2O_7$ is hard to form $Pb(Mg_{1/3}Nb_{2/3})O_3$ in a perovskite-type structure by a solid-state reaction between the $Pb_2Nb_2O_7$ and MgO. From these standpoints, it has been discovered, according to the present invention, that the amount of $Pb_2Nb_2O_7$ is remarkably decreased by employing a high heating rate at a vicinity of 600° C. in the preparation process of ternary solid solution of $$Pb(Mg_{1/3}Nb_{2/3})O_3\text{-}PbTiO_3\text{-}PbZrO_3$$

It is sufficient to control the heating rate in the temperature range of 500° to 650° C. Operable heating rates range from 50° C. per minute to 10° C. per minute. Another temperature range in the preparation process is not required to have specified heating rate. The higher heating rate in the temperature range clearly reduces the amount of $Pb_2Nb_2O_7$ in an intermediate product at a vicinity of 600° C. as well as in a final product fired at high temperature.

According to the present invention, the amount of $Pb_2Nb_2O_7$ can be also reduced by adding an excessive magnesium oxide i.e. an excess of magnesium oxide onto base compositions of stoichiometric ternary system. A term "excessive magnesium oxide" or "an excess of magnesium oxide" as used herein represents an extra magnesium oxide over and above the magnesium oxide which is a component to form a stoichiometric ternary solid solution of $Pb(Mg_{1/3}Nb_{2/3})O_3$-$PbTiO_3$-$PbZrO_3$. Operable Referring to FIGURE 2, the following amounts of excessive magnesium oxide can be employed in the various base compositions:

TABLE 2

| Areas of triangular compositional diagram (figure 2) | Operable weight percent of excessive MgO | Preferable weight percent of excessive MgO |
|---|---|---|
| ABCDEFG | 0.005-2 | 0.005-1.5 |
| ABEFG | 0.1-2 | 0.2-1.5 |
| BCDE | 0.005-0.5 | 0.005-0.2 |

The base ternary solid solution of $$Pb(Mg_{1/3}Nb_{2/3})O_3\text{-}PbTiO_3\text{-}PbZrO_3$$

defined by the polygonal area

ABCDEFGH of the diagram of FIGURE 2 have been known to improve piezoelectric properties when the said base ceramics are modified by containing, as a substituent for an equivalent amount of lead therein, from zero to 20 atom percent of at least one metal selected from the group consisting of strontium, barium and calcium, or by addition of 0.1 to 3 weight percent of at least one metal oxide selected from the group consisting of manganese oxide, nickel oxide, iron oxide, chromium oxide and cobalt oxide. For example, substitution of lead with strontium remarkably improves the dielectric constant of resultant ceramics and an addition of manganese oxide and nickel oxide strongly improve the mechanical quality factor $Q_M$, and the coupling coefficient $k_p$, respectively. Additive combination of manganese oxide and nickel oxide produces an entirely satisfactory electric wave filter having a high coupling coefficient and a high mechanical quality factor. According to the present invention, the addition of excessive magnesium oxide can impart a further improvement of piezoelectric properties to said modified ternary solid solution ceramics defined above. In the case of aforesaid modified ternary solid solution ceramics, preferable amounts of excessive magnesium oxide are exactly similar to those described in Table 2 in connection with the areas of triangular compositional diagram of FIGURE 2.

The aforesaid desirable effects of high heating rates in the temperature range of 500° to 650° C. also can be attained with unmodified or modified ternary solid solution ceramics having an excessive magnesium oxide. An additional improvement in the $\epsilon$, $k_p$ and $Q_M$ can be given to unmodified or modified base ternary solid solution having an excessive magnesium oxide by employing a heating rate of 10° C. to 50° C./minute at the temperature range of 500° to 650° C. From the scope of this invention it will be readily understood that an unheated mixture of raw ingredients needs the said specified heating rate but a calcined mixture does not need it during a firing process.

The composition described herein may be prepared in accordance with various well known ceramic procedures. A preferred method, however, hereinafter more fully described, consists in the use of PbO or $Pb_3O_4$, MgO or $MgCO_3$, $Nb_2O_5$, $TiO_2$ and $ZrO_2$.

The starting materials, viz, lead oxide (PbO), magnesia (MgO), niobium pentoxide ($Nb_2O_5$), titanium dioxide ($TiO_2$), and zirconia ($ZrO_2$), all of relatively pure grade (e.g., C.P. grade) are intimately mixed in a rubber-lined ball mill with distilled water. In milling the mixture, care should be exercised to avoid, or the proportions of ingredients varied to compensate for, contamination by wear of the milling ball or stones.

Following the wet milling, the mixture is dried and mixed to assure as homogeneous a mixture as possible. Thereafter, the mixture is suitably formed into desired forms at a pressure of 400 kg./cm.². The compacts are pre-reacted by calcination at a temperature of around 850° C. for 2 hours. A heating rate in the temperature of 500° to 650° C. is approximately 20° C./minute.

After calcination, the reacted material is allowed to cool and is then wet milled into a small particle size. Once again, care should be exercised to avoid, or the proportions of ingredients varied to compensate for, contamination by wear of the milling balls or stones. Depending on preference and the shapes desired the material may be formed into a mix or slip suitable for pressing, slip casting, or extruding, in accordance with conventional ceramic procedures. The sample for which data are given hereinbelow are prepared by mixing 100 grams of the milled pre-sintered mixture with 5 cc. of distilled water. The mix is then pressed into discs of 20 mm. diameter and 2 mm. thickness at a pressure of 700 kg./cm.² and fired at various temperatures for 45 minutes of heating period. Thus, according to the present invention, uniform and excellent piezoelectric ceramic products can be easily obtained simply by covering the samples with an alumina crucible.

The sintered ceramics are polished on both surfaces to the thickness of one millimeter. The polished disc surfaces may then be coated with silver paint and fired to form silver electrodes. Finally, the discs are polarized while being immersed in a bath of silicone oil at 100° C. A DC voltage gradient of 4 kv. per mm. is maintained for one hour, and the discs are field-cooled to room temperature in thirty minutes.

The dielectric and piezoelectric properties of the polarized specimen are measured at 20° C. in a relative humidity of 50% and at a frequency of 1 kc. A measurement of piezoelectric properties is made by the IRE standard circuit and the planar coupling coefficient is determined by the resonant to antiresonant frequency method. These data are listed in Table 3, wherein additive oxide and excessive magnesium oxide are expressed by the respective weight percent and the remainder is the intended base compositions.

TABLE 3

| Corresponding No. of Fig. 2 | Base material | Additive oxides, weight percent | Excessive MgO, weight percent | Dielectric constant, $\epsilon$ at 1 kc. | Planar coupling coefficient, $k_p$ | Mechanical quality factor, $Q_M$ | Firing temp., ° C. | Density, gms./cm.³ |
|---|---|---|---|---|---|---|---|---|
| 1 | $Pb(Mg_{1/3}Nb_{2/3})_{0.59}Ti_{0.41}O_3$ | None | None | 1,296 | 0.244 | 193 | 1,270 | 7.44 |
| | $Pb(Mg_{1/3}Nb_{2/3})_{0.59}Ti_{0.41}O_3$ | do | 1.0 | 1,310 | 0.253 | 196 | 1,270 | 7.48 |
| 2 | $Pb(Mg_{1/3}Nb_{2/3})_{0.5}Ti_{0.375}Zr_{0.125}O_3$ | do | None | 1,583 | 0.293 | 107 | 1,270 | 7.58 |
| | $Pb(Mg_{1/3}Nb_{2/3})_{0.5}Ti_{0.375}Zr_{0.125}O_3$ | do | 0.8 | 1,852 | 0 348 | 112 | 1,270 | 7.61 |
| 3 | $Pb(Mg_{1/3}Nb_{2/3})_{0.4375}Ti_{0.4375}Zr_{0.125}O_3$ | $MnO_2$, 1.0 | None | 1,270 | 0.382 | 1,250 | 1,290 | 7.63 |
| | $Pb(Mg_{1/3}Nb_{2/3})_{0.4375}Ti_{0.4375}Zr_{0.125}O_3$ | $MnO_2$, 1.0 | 0.6 | 1,378 | 0.391 | 1,354 | 1,290 | 7.74 |
| 4 | $Pb(Mg_{1/3}Nb_{2/3})_{0.25}Ti_{0.375}Zr_{0.375}O_3$ | None | None | 976 | 0.498 | 103 | 1,300 | 7.61 |
| | $Pb(Mg_{1/3}Nb_{2/3})_{0.25}Ti_{0.375}Zr_{0.375}O_3$ | $MnO_2$, 0.2 | None | 774 | 0.453 | 282 | 1,300 | 7.59 |
| | $Pb(Mg_{1/3}Nb_{2/3})_{0.25}Ti_{0.375}Zr_{0.375}O_3$ | $MnO_2$, 0.2 | 0.1 | 852 | 0.475 | 280 | 1,300 | 7.62 |
| | $Pb(Mg_{1/3}Nb_{2/3})_{0.25}Ti_{0.375}Zr_{0.375}O_3$ | CoO, 1.0 | None | 451 | 0.364 | 452 | 1,280 | 7.22 |
| | $Pb(Mg_{1/3}Nb_{2/3})_{0.25}Ti_{0.375}Zr_{0.375}O_3$ | CoO, 1.0 | 0.15 | 529 | 0.436 | 398 | 1,280 | 7.45 |
| | $Pb(Mg_{1/3}Nb_{2/3})_{0.25}Ti_{0.375}Zr_{0.375}O_3$ | NiO, 0.2, | None | 996 | 0.485 | 155 | 1,280 | 7.57 |
| | $Pb(Mg_{1/3}Nb_{2/3})_{0.25}Ti_{0.375}Zr_{0.375}O_3$ | NiO, 0.2 | 0.1 | 1,026 | 0.494 | 170 | 1,280 | 7.60 |
| | $Pb(Mg_{1/3}Nb_{2/3})_{0.25}Ti_{0.375}Zr_{0.375}O_3$ | $Cr_2O_3$, 1.0 | None | 772 | 0.422 | 217 | 1,280 | 7.38 |
| | $Pb(Mg_{1/3}Nb_{2/3})_{0.25}Ti_{0.375}Zr_{0.375}O_3$ | $Cr_2O_3$, 1.0 | 0.1 | 790 | 0.45 | 230 | 1,280 | 7.45 |
| 5 | $Pb(Mg_{1/3}Nb_{2/3})_{0.125}Ti_{0.435}Zr_{0.44}O_3$ | None | None | 1,246 | 0.492 | 101 | 1,310 | 7.49 |
| | $Pb(Mg_{1/3}Nb_{2/3})_{0.125}Ti_{0.435}Zr_{0.44}O_3$ | do | 0.1 | 1,365 | 0.510 | 120 | 1,300 | 7.52 |
| 5 | $Pb_{0.85}Sr_{0.15}(Mg_{1/3}Nb_{2/3})_{0.125}Ti_{0.435}Zr_{0.44}O_3$. | do | None | 2,347 | 0.398 | 110 | 1,310 | 7.53 |
| | $Pb_{0.85}Sr_{0.15}(Mg_{1/3}Nb_{2/3})_{0.125}Ti_{0.435}Zr_{0.44}O_3$. | do | 0.08 | 2,359 | 0.420 | 120 | 1,310 | 7.55 |
| 6 | $Pb(Mg_{1/3}Nb_{2/3})_{0.375}Ti_{0.375}Zr_{0.25}O_3$ | do | None | 1,587 | 0.480 | 96 | 1,280 | 7.60 |
| | $Pb(Mg_{1/3}Nb_{2/3})_{0.375}Ti_{0.375}Zr_{0.25}O_3$ | $MnO_2$, 1.0 | None | 742 | 0.453 | 1,577 | 1,270 | 7.43 |
| | $Pb(+g_{1/3}Nb_{2/3})_{0.375}Ti_{0.375}Zr_{0.25}O_3$ | $MnO_2$, 1.0 | 0.1 | 825 | 0.456 | 1,620 | 1,270 | 7.51 |
| | $Pb(Mg_{1/3}Nb_{2/3})_{0.375}Ti_{0.375}Zr_{0.25}O_3$ | NiO, 1.0 | None | 1,646 | 0.502 | 149 | 1,250 | 7.57 |
| | $Pb(Mg_{1/3}Nb_{2/3})_{0.375}Ti_{0.375}Zr_{0.25}O_3$ | NiO, 1.0 | 0.1 | 1,720 | 0.511 | 149 | 1,250 | 7.56 |
| | $Pb(Mg_{1/3}Nb_{2/3})_{0.375}Ti_{0.375}Zr_{0.25}O_3$ | NiO, 0.5 $MnO_2$, 0.5 | None | 932 | 0.553 | 2,051 | 1,260 | 7.74 |
| | $Pb(Mg_{1/3}Nb_{2/3})_{0.375}Ti_{0.375}Zr_{0.25}O_3$ | NiO, 0.5 $MnO_2$, 0.5 | 0.15 | 968 | 0.572 | 2,225 | 1,260 | 7.76 |

TABLE 4

| Compositions (weight percent) | | Phase (relative intensity determined from X-ray diffraction pattern peaks) (percent) | | | | | | |
|---|---|---|---|---|---|---|---|---|
| Base Material | Excessive MgO | Pyrochlore | Perovskite | MgO | Dielectric constant $\epsilon$, at 1 kc. | Planar coupling coefficient, $k_p$ | Mechanical quality factor, $Q_M$ | Density (gms./cm.³) |
| 100 | 0 | 10 | 90 | 0 | 1,583 | 0.293 | 107 | 7.58 |
| 99.8 | 0.2 | 2 | 98 | 0 | 1,725 | 0.314 | 107 | 7.59 |
| 99.6 | 0.4 | 1 | 99 | 0 | 1,830 | 0.325 | 110 | 7.59 |
| 99.4 | 0.6 | 0 | 100 | 0 | 1,848 | 0.346 | 113 | 7.60 |
| 99.2 | 0.8 | 0 | 100 | 0 | 1,852 | 0.348 | 112 | 7.61 |
| 99.0 | 1.0 | 0 | ~100 | <1 | 1,825 | 0.336 | 112 | 7.55 |
| 98.8 | 1.2 | 0 | 99 | 1 | 1,825 | 0.250 | 110 | 7.49 |
| 98.5 | 1.5 | 0 | 98 | 2 | 1,807 | 0.222 | 105 | 7.40 |

The following Table 4 illustrates the effect of excessive magnesium oxide on the $\epsilon$, $k_p$ and $Q_M$ of ternary solid solution ceramics defined by $0.5Pb(Mg_{1/3}Nb_{2/3})O_3$-$0.375PbTiO_3$-$0.125PbZrO_3$. Mixtures of ingredients in given compositions are made in a similar way to that described in the preceding specifications and heated at a rate of 5° C./minute from room temperature to 850° C. and maintained at the temperature for 2 hours for calcination. A specified heating rate in the temperature range of 500° to 650° C. is not employed in view of the clarification of only effects of excessive magnesium oxide. The calcined mixture is pressed at a pressure of 700 kg./cm.$^2$ and fired at 1250° C. for 45 minutes in the same manner to that described in the specification. It will be readily understood that the $\epsilon$, $k_p$ and $Q_M$ increase with an increase in the amount of excessive magnesium oxide and show an optimum value at the compositions of single phase of perovskite-type structure. A further amount of magnesium oxide produces two phases of perovskite-type structure and magnesium oxide phase and deteriorates the $\epsilon$, $k_p$ and $Q_M$ as shown in Table 4.

The effects of specified heating rate will be readily understood by the following example in accordance with this invention.

A mixture in a composition which has the empirical formula $Pb(Mg_{1/3}Nb_{2/3})_{0.4375}Ti_{0.4375}Zr_{0.125}O_3$ plus 1.0 wt. percent $MnO_2$ and 0.6 wt. percent MgO listed in Table 5 corresponds to Example No. 3 in FIGURE 2 and is well milled and then pressed in a similar way to that described in the preceding specification. A half part of the pressed mixture is heated from room temperature to 800° C. at a heating rate of 20° C./minute and maintained at 850° C. for 2 hours for calcination (Example No. 1 in Table 6). Another half part of the mixtures is heated at a heating rate of 3° C./minute from room temperature to 850° C. and finally maintained at 850° C. for 2 hours for calcination (Example No. 2 in Table 6). Both calcined parts are pressed and fired at 1290° C. for 45 minutes in a similar manner to that described in the preceding specifications. The obtained results are shown in Table 6. It will be understood that the specified heating rate clearly improves the $\epsilon$, $k_p$ and $Q_M$ of ternary solid solution ceramics in various compositions.

TABLE 5

Empirical formula:

$Pb(Mg_{1/3}Nb_{2/3})_{0.4375}Ti_{0.4375}Zr_{0.125}O_3$ +1.0 wt. percent $MnO_2$+0.6 wt. percent MgO

| Raw material: | Weight (gms.) |
|---|---|
| PbO | 1346.0 |
| MgO | 35.8 |
| $Nb_2O_5$ | 233.0 |
| $TiO_2$ | 210.0 |
| $ZrO_2$ | 93.0 |
| $MnO_2$ | 19.2 |

TABLE 6

| Example No. | Heating rate of calcination, ° C./min: | Dnensity, gms./cm.$^3$ | Dielectric constant $\epsilon$, at 1KC. | Planar coupling coefficient, $k_p$ percent | Mechanical quality factor, $Q_m$ |
|---|---|---|---|---|---|
| 1 | 20 | 7.74 | 1,360 | 39.1 | 1,354 |
| 2 | 3 | 67.3 | 1,270 | 38.1 | 1,289 |

What is claimed is:

1. A process for preparing an improved piezoelectric ceramic material consisting essentially of a material having a composition within the polygonal structure ABCDEFG in the triangular composition diagram of FIGURE 2 wherein the mol ratio of the three components of each vertex are as follows:

| | X | Y | Z |
|---|---|---|---|
| A | 0.500 | 0.500 | 0 |
| B | 0.250 | 0.625 | 0.125 |
| C | 0.010 | 0.615 | 0.375 |
| D | 0.010 | 0.240 | 0.750 |
| E | 0.500 | 0.125 | 0.375 |
| F | 0.625 | 0.125 | 0.250 |
| G | 0.625 | 0.374 | 0 |

which consists of heating a mixture of lead, niobium, magnesium, titanium, and zirconium oxides in proportions that produce said ceramic material to a ceramic forming temperature, said heating to a ceramic forming temperature being at a rate of 10° to 50° C./minute in the temperature range of 500° to 650° C.

2. A process according to claim 1 wherein prior to heating 0.005% to 2% by weight of magnesium oxide is added to the material having a composition within the polygonal structure.

3. A process according to claim 2 wherein prior to heating 0.1 to 3% by weight of at least one oxide selected from the group consisting of manganese, nickel, iron, chromium and cobalt oxides is added to the mixture containing the material having a composition within the polygonal structure and 0.005 to 2% by weight of magnesium oxide.

4. A process according to claim 2 wherein up to 20 atom percent of the lead in the material having a composition within the polygonal structure is replaced prior to heating by at least one element selected from the group consisting of calcium, strontium and barium.

5. A process according to claim 2 wherein 0.005 to 1.5% by weight of magnesium oxide is added to the material having a composition within the polygonal structure and the heating is carried out at 20° C./minute in the temperature range of 500° to 650° C.

6. A process according to claim 3 wherein the magnesium oxide is present in an amount from 0.005 to 1.5% and the heating is carried out at 20° C./minute in the temperature range of 500° to 650° C.

7. A process according to claim 5 wherein up to 15 atom percent of the lead in the material having a composition within the polygonal structure is replaced prior to heating by at least one element selected from the group consisting of calcium, strontium, and barium.

References Cited

UNITED STATES PATENTS 3,179,594 4/1965 Kulcsar et al. ------ 252—62.9
3,268,453 8/1966 Ouchi et al. -------- 252—62.9

TOBIAS E. LEVOW, *Primary Examiner.*

R. D. EDMONDS, *Assistant Examiner.*

U.S. Cl. X.R.

106—39